United States Patent
Shefer

(10) Patent No.: US 9,605,934 B1
(45) Date of Patent: Mar. 28, 2017

(54) RELAYING OF MISSILE BODY ROLL ANGLE

(71) Applicant: Mordechai Shefer, Haifa (IL)

(72) Inventor: Mordechai Shefer, Haifa (IL)

(*) Notice: Subject to any disclaimer, the term of this patent is extended or adjusted under 35 U.S.C. 154(b) by 333 days.

(21) Appl. No.: 14/588,417

(22) Filed: Jan. 1, 2015

Related U.S. Application Data

(60) Provisional application No. 61/933,320, filed on Jan. 30, 2014.

(51) Int. Cl.
| | |
|---|---|
| *F42B 10/60* | (2006.01) |
| *F42B 10/64* | (2006.01) |
| *F42B 10/02* | (2006.01) |
| *F41G 7/30* | (2006.01) |
| *G05D 1/10* | (2006.01) |
| *H04L 27/36* | (2006.01) |
| *F42B 10/00* | (2006.01) |
| *F41G 7/00* | (2006.01) |

(52) U.S. Cl.
CPC ............ *F42B 10/64* (2013.01); *F41G 7/30* (2013.01); *F41G 7/301* (2013.01); *F41G 7/306* (2013.01); *F42B 10/02* (2013.01); *F42B 10/60* (2013.01); *G05D 1/108* (2013.01); *H04L 27/36* (2013.01)

(58) Field of Classification Search
CPC .......... F42B 10/02; F42B 10/60; F42B 10/62; F42B 10/64; F42B 15/01; G05D 1/10; G05D 1/107; G05D 1/108; H04L 27/32; H04L 27/34; H04L 27/36; F41G 7/20; F41G 7/30; F41G 7/301; F41G 7/305; F41G 7/306; F41G 7/34; F41G 7/303
See application file for complete search history.

(56) References Cited

U.S. PATENT DOCUMENTS

| | | | | |
|---|---|---|---|---|
| 3,588,002 A | * | 6/1971 | White | F41G 7/301 |
| | | | | 244/3.14 |
| 4,967,981 A | * | 11/1990 | Yff | F41G 7/305 |
| | | | | 244/3.14 |
| 4,989,624 A | | 2/1991 | Darling | |
| 4,997,000 A | | 3/1991 | Feast | |
| 5,037,487 A | | 8/1991 | Santos | |
| 5,414,430 A | | 5/1995 | Hansen | |
| 6,293,488 B1 | * | 9/2001 | Wells | F41G 7/303 |
| | | | | 244/3.11 |

(Continued)

FOREIGN PATENT DOCUMENTS

CN  103728647  4/2014

*Primary Examiner* — Bernarr Gregory
(74) *Attorney, Agent, or Firm* — Mark M. Friedman

(57) ABSTRACT

A method is presented by which a missile body roll angle relative to earth coordinates can be deciphered onboard the missile from ground-data relayed to the missile during flight The present method comprises of a horizontal pair and a vertical pair of antennas on the ground and an up-down pair and a right-left pair of antennas onboard the missile. The ground to pairs signals are sinusoidally amplitude modulated in 90° phase difference between the two pairs, causing the transmitted wave polarity to rotate in the modulation frequency. A reference pulse is transmitted from the ground whenever the wave polarity vector crosses a prescribed ground antenna direction, thereby enabling the missile to measure its body up, down, right and left directions relative to earth up, down, right and left directions and to further respectively align them together.

12 Claims, 2 Drawing Sheets

Missile Antennas     Ground Antennas

Missile and Ground Antennas

(56) References Cited

U.S. PATENT DOCUMENTS

| | | | | |
|---|---|---|---|---|
| 6,724,341 B1* | 4/2004 | Pereira | .................... | F42B 15/01 |
| | | | | 244/3.1 |
| 7,977,613 B2* | 7/2011 | Rastegar | ................ | F41G 7/305 |
| | | | | 244/3.1 |
| 8,076,621 B2* | 12/2011 | Rastegar | ................ | F41G 7/305 |
| | | | | 244/3.1 |
| 8,258,999 B2* | 9/2012 | Rastegar | ................ | F41G 7/305 |
| | | | | 244/3.1 |
| 8,324,542 B2* | 12/2012 | Frey, Jr. | ................ | F41G 7/305 |
| | | | | 244/3.1 |
| 8,552,349 B1* | 10/2013 | Alexander | ............. | F42B 10/26 |
| | | | | 102/200 |
| 8,598,501 B2* | 12/2013 | Meyer | .................... | F42B 15/01 |
| | | | | 244/3.1 |
| 8,637,798 B2* | 1/2014 | Rastegar | .................. | F41G 7/34 |
| | | | | 244/3.1 |
| 2005/0274751 A1 | 12/2005 | Plumley | | |
| 2010/0283657 A1 | 11/2010 | Vollin | | |
| 2012/0228423 A1 | 9/2012 | Rastegar et al. | | |
| 2012/0291823 A1 | 11/2012 | Trent | | |

\* cited by examiner

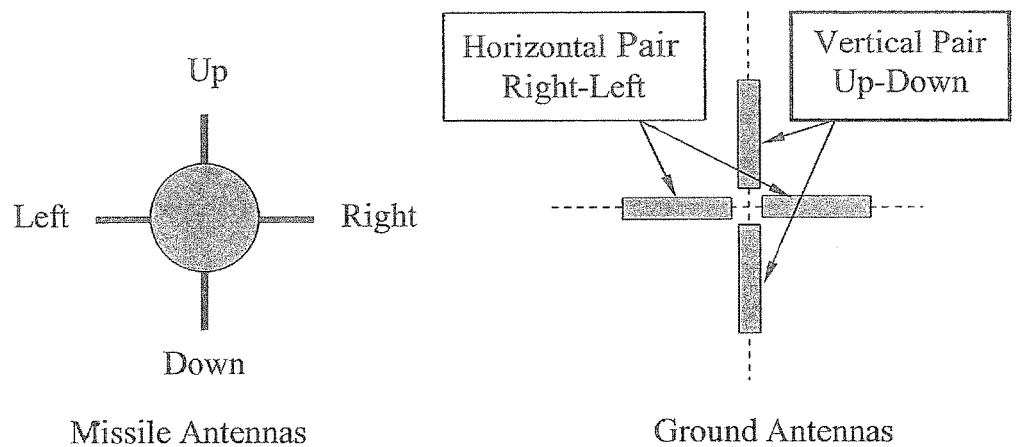
Figure 1, Missile and Ground Antennas

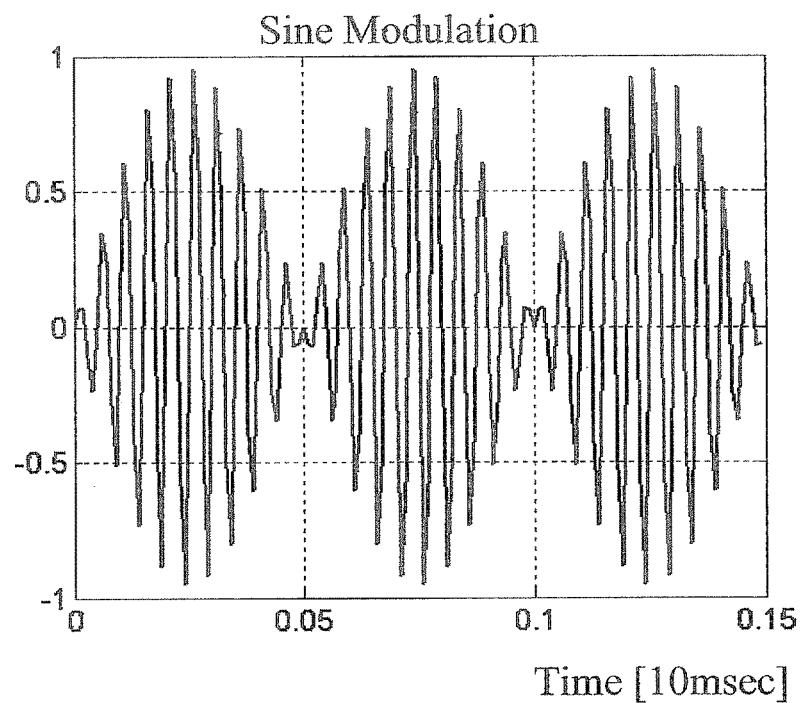
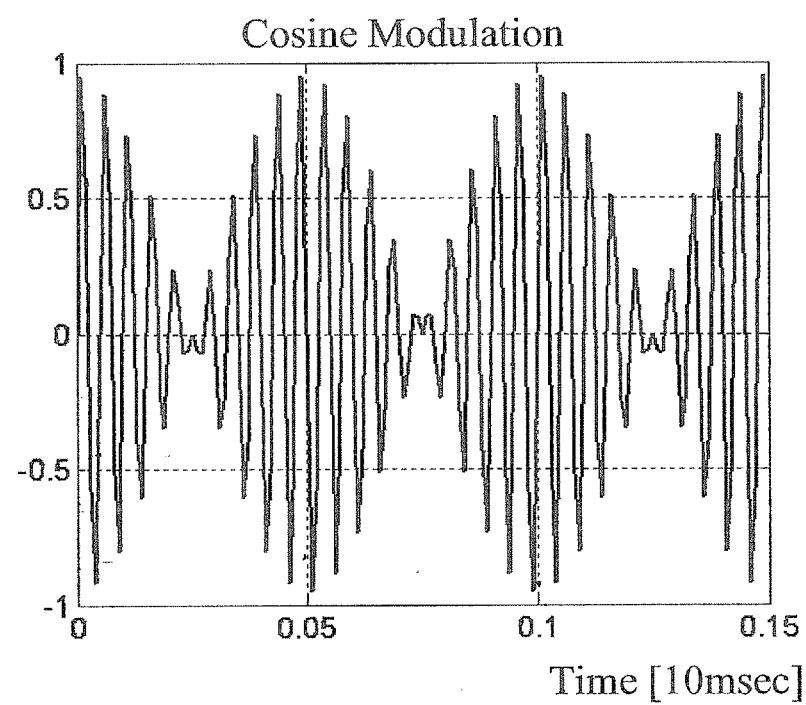
Figure 2, Sine and Cosine Modulations

RELAYING OF MISSILE BODY ROLL ANGLE

FIELD AND BACKGROUND OF THE INVENTION

The missile inertial roll angle is an essential parameter that the missile relies on when it directs itself towards the target. Without the knowledge of its body roll angle in inertial space the missile cannot translate the inertial up, down, right, and left steering commands which guide it towards the target into adequate commands in the steering mechanisms axes. This is a common situation in the ground-assisted, mid-course phase of missiles interception processes, in the stage where the missile seeker has not yet acquired the target.

The traditional approach to the onboard inertial roll angle estimation during mid-course is to use an inertial roll-rate sensor onboard the missile and continuously integrate its output to have the inertial roll angle. It turns out however that the accuracies achievable with inertial roll-rate sensors do not quite meet the requirements for successful seeker acquisition and missile guidance. There is thus a widely recognized need for, and it would be highly advantageous to have, a method for onboard inertial roll angle estimation during mid-course, whose accuracies satisfy the mid-course guidance requirements.

SUMMARY OF THE INVENTION

The present invention is a method of ground to missile data transmission that provides the missile with the knowledge of its body up, down, right and left directions relative to ground up, down, right and left directions. This knowledge in turn enables the missile to command its roll angle so as to respectively align its said body directions with said ground directions.

According to further features in the described preferred embodiments, the format of the data transmitted from the ground to the missile enables the missile to update its knowledge of its inertial roll angle in a sufficiently high rate such as e.g., 1,000 updates per second.

According to yet further features in the described preferred embodiments the present invention successfully addresses the shortcomings of the presently known configurations with minor hardware modifications relative to traditional systems.

BRIEF DESCRIPTION OF THE DRAWINGS

The invention is herein described by way of example only, with reference to the accompanying drawings, wherein:

FIG. 1 is a description of the ground and missile onboard antennas.

FIG. 2 is a description of the sine-cosine amplitude modulations of the ground to missile transmission.

DESCRIPTION OF THE PREFERRED EMBODIMENTS

The principles and operation of a roll-data relaying method according to the present invention may be better understood with reference to the drawings and the accompanying description.

Referring now to the drawings, FIG. 1 illustrates a ground antennas setup and a missile antennas setup of the present invention. Each setup is comprised of 4 elements. The ground antennas are arranged such that they are correspondingly aligned with ground up, down, left and right directions. The missile antennas are aligned with the missile-body up, down, left and right directions.

The ground horizontal (right-left) and vertical (up-down) antenna-pairs transmit the exact same high frequency data which is traditionally needed to the missile during interception. However, the 2 (up-down and right-left) signals are separately amplitude-modulated (AM) in a low frequency relative to that of the carrier, but yet sufficiently high in the roll-control context, such as e.g., 1,000 Hz, where one of those signals, say the up-down one, is modulated by e.g., a Sine function of time whereas the other signal, say the right-left one, is modulated by e.g., a Cosine function of time, as is depicted in FIG. 2, where the use of the Sine and Cosine terms only comes to say that the phase-shift between said 2 signals in the modulation frequency is exactly 90° (ninety degrees).

The two amplitude-modulated signals are mutually synchronized so that the said sine-cosine modulation causes the polarity vector of the transmitted wave to rotate at the modulation frequency in time about a horizontal axis perpendicular to the ground antennas plane. Additionally, each time said polarity vector crosses a prescribed ground antenna direction, say, the right-hand antenna, a short reference pulse in a special format is also transmitted by the ground antennas.

Onboard the missile the received rotating polarity vector rotates about the missile body roll axis. Thus, with the received reference say, ground-right pulse, the missile can now command-rotate its body about its roll axis such that the polarity-vector crossing of its say, body right-antenna, coincides in time with the said reference say, ground right pulse. When this occurs, the missile roll angle comes to a position where its body right, left, up and down directions respectively coincide with that of the ground right, left, up and down directions, thereby accomplishing the goal of the present invention.

While the invention has been described with respect to a limited number of embodiments, it will be appreciated that many variations, modifications and other applications of the invention may be made.

What is claimed is:

1. A method of guiding a missile from a ground station, the missile including a missile body, the missile body and the ground station having respective up, down, left, and right directions, the missile body directions defined in the reference frame of the missile body, wherein the ground station includes an up transmitting antenna, a down transmitting antenna, a right transmitting antenna and a left transmitting antenna, the ground station antennas aligned with the ground station respective up, down, right and left directions, the method comprising:

transmitting data from the ground station to the missile, the data including a value of the missile roll angle in a horizontal axis reference frame of the ground station;

receiving the transmitted data on missile; and aligning the missile body up, down, left, and right directions with corresponding ground station up, down, left, and right directions according to the value in the received data.

2. The method of claim 1, wherein the missile includes an up receiving antenna, a down receiving antenna, a right receiving antenna and a left receiving antenna, the missile receiving antennas aligned with the missile body respective up, down, right and left directions.

3. The method of claim 1, wherein the transmitting data from the ground station to the missile includes:
   transmitting a first sinusoidally amplitude-modulated signal from the up-down pair of ground antennas, and
   transmitting a second sinusoidally amplitude-modulated signal from the right-left pair of ground station antennas, the second signal having a ninety degrees phase-difference from the first signal, such that, the transmitted wave polarity vector of the combined first and second signals rotates in time in the modulation frequency about the horizontal axis reference frame of the ground station perpendicular to the plane of the ground station antennas.

4. The method of claim 3, wherein the frequency of the first and second sinusoidally amplitude-modulated signals is approximately 1,000 Hz.

5. The method of claim 3, wherein the transmitting data from ground station to the missile further includes:
   transmitting a short reference pulse whenever the transmitted wave polarity vector of the combined first and second signals crosses a prescribed ground antenna direction.

6. The method of claim 5, wherein the missile includes an up receiving antenna, a down receiving antenna, a right receiving antenna and a left receiving antenna, the missile receiving antennas aligned with the missile body respective up, down, right and left directions, and the method further comprises:
   receiving the short reference pulses on the missile; and
   measuring the direction of each missile antenna relative to the corresponding ground station up, down, left, and right directions based on the received short reference pulses.

7. A method of guiding a missile from a ground station, the missile including a missile body, the missile body and the ground station having respective up, down, left, and right directions, the missile body directions defined in the reference frame of the missile body, wherein the missile includes an up receiving antenna, a down receiving antenna, a right receiving antenna and a left receiving antenna, the missile receiving antennas aligned with the missile body respective up, down, right and left directions, the method comprising:
   transmitting data from the ground station to the missile, the data including a value of the missile roll angle in a horizontal axis reference frame of the ground station;
   receiving the transmitted data on missile; and
   aligning the missile body up, down, left, and right directions with corresponding ground station up, down, left, and right directions according to the value in the received data.

8. The method of claim 7, wherein the ground station includes an up transmitting antenna, a down transmitting antenna, a right transmitting antenna and a left transmitting antenna, the ground station antennas aligned with the ground station respective up, down, right and left directions.

9. The method of claim 8, wherein the transmitting data from the ground station to the missile includes:
   transmitting a first sinusoidally amplitude-modulated signal from the up-down pair of ground antennas, and
   transmitting a second sinusoidally amplitude-modulated signal from the right-left pair of ground station antennas, the second signal having a ninety degrees phase-difference from the first signal, such that, the transmitted wave polarity vector of the combined first and second signals rotates in time in the modulation frequency about the horizontal axis reference frame of the ground station perpendicular to the plane of the ground station antennas.

10. The method of claim 9, wherein the frequency of the first and second sinusoidally amplitude-modulated signals is approximately 1,000 Hz.

11. The method of claim 9, wherein the transmitting data from ground station to the missile further includes:
    transmitting a short reference pulse whenever the transmitted wave polarity vector of the combined first and second signals crosses a prescribed ground antenna direction.

12. The method of claim 11, wherein the missile includes an up receiving antenna, a down receiving antenna, a right receiving antenna and a left receiving antenna, the missile receiving antennas aligned with the missile body respective up, down, right and left directions, and the method further comprises:
    receiving the short reference pulses on the missile; and
    measuring the direction of each missile antenna relative to the corresponding ground station up, down, left, and right directions based on the received short reference pulses.

* * * * *